US012588527B2

(12) United States Patent
Chong et al.

(10) Patent No.: US 12,588,527 B2
(45) Date of Patent: Mar. 24, 2026

(54) DIELECTRIC INTERPOSER WITH ELECTRICAL-CONNECTION CUT-IN

(71) Applicant: Micron Technology, Inc., Boise, ID (US)

(72) Inventors: Chin Hui Chong, Singapore (SG); Seng Kim Ye, Singapore (SG); Hong Wan Ng, Singapore (SG); Kelvin Aik Boo Tan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 665 days.

(21) Appl. No.: 18/047,411

(22) Filed: Oct. 18, 2022

(65) Prior Publication Data

US 2024/0128182 A1 Apr. 18, 2024

(51) Int. Cl.
| | |
|---|---|
| *H01L 23/48* | (2006.01) |
| *H01L 21/48* | (2006.01) |
| *H01L 23/00* | (2006.01) |
| *H01L 23/498* | (2006.01) |
| *H01L 23/52* | (2006.01) |
| *H01L 25/00* | (2006.01) |
| *H01L 25/065* | (2023.01) |

(52) U.S. Cl.
CPC .... *H01L 23/49838* (2013.01); *H01L 21/4857* (2013.01); *H01L 24/16* (2013.01); *H01L 24/48* (2013.01); *H01L 24/49* (2013.01); *H01L 24/73* (2013.01); *H01L 25/0652* (2013.01); *H01L 25/50* (2013.01); *H01L 2224/16227* (2013.01); *H01L 2224/16238* (2013.01); *H01L 2224/48228* (2013.01); *H01L 2224/48229* (2013.01); *H01L 2224/49109* (2013.01); *H01L*

*2224/49175* (2013.01); *H01L 2224/73257* (2013.01); *H01L 2924/1433* (2013.01); *H01L 2924/1436* (2013.01); *H01L 2924/1437* (2013.01); *H01L 2924/1438* (2013.01)

(58) Field of Classification Search
CPC ........... H01L 23/49838; H01L 21/4857; H01L 24/48; H01L 24/73; H01L 2224/16227; H01L 2224/48228; H01L 2224/49175; H01L 2224/73257; H01L 2924/1436; H01L 2924/1437; H01L 23/13; H01L 23/49816; H01L 23/49827; H01L 2224/48225; H10B 80/00
USPC ......................................................... 257/690
See application file for complete search history.

(56) References Cited

U.S. PATENT DOCUMENTS

2012/0153445 A1* 6/2012 Son ................... H01L 23/49833
257/668

* cited by examiner

*Primary Examiner* — Theresa T Doan
(74) *Attorney, Agent, or Firm* — Harrity & Harrity, LLP

(57) ABSTRACT

Implementations described herein relate to various semiconductor device assemblies. In some implementations, a semiconductor device assembly may include a base layer, a dielectric interposer coupled to the base layer and including a first outer surface facing the base layer and an opposing second outer surface facing away from the base layer and spaced apart from the first outer surface in a direction, a first electrical-connection cut-in in the second outer surface that extends, in the direction, toward the first outer surface, and one or more first electrical connections disposed within the first electrical-connection cut-in such that at least a portion of the one or more first electrical connections does not extend, in the direction, beyond the second outer surface.

35 Claims, 13 Drawing Sheets

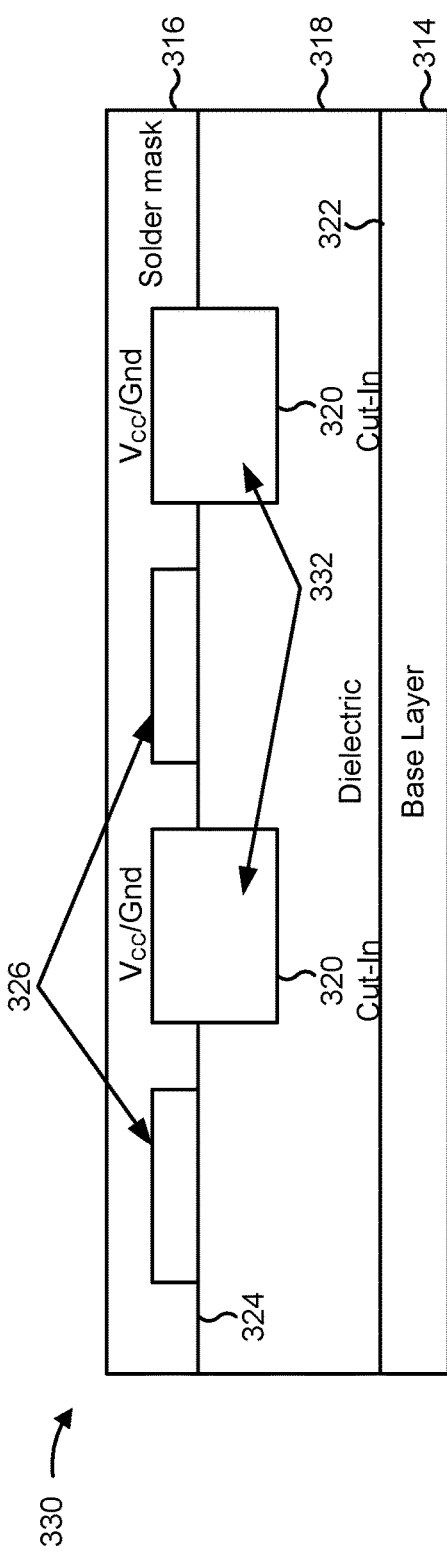
FIG. 3B

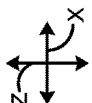
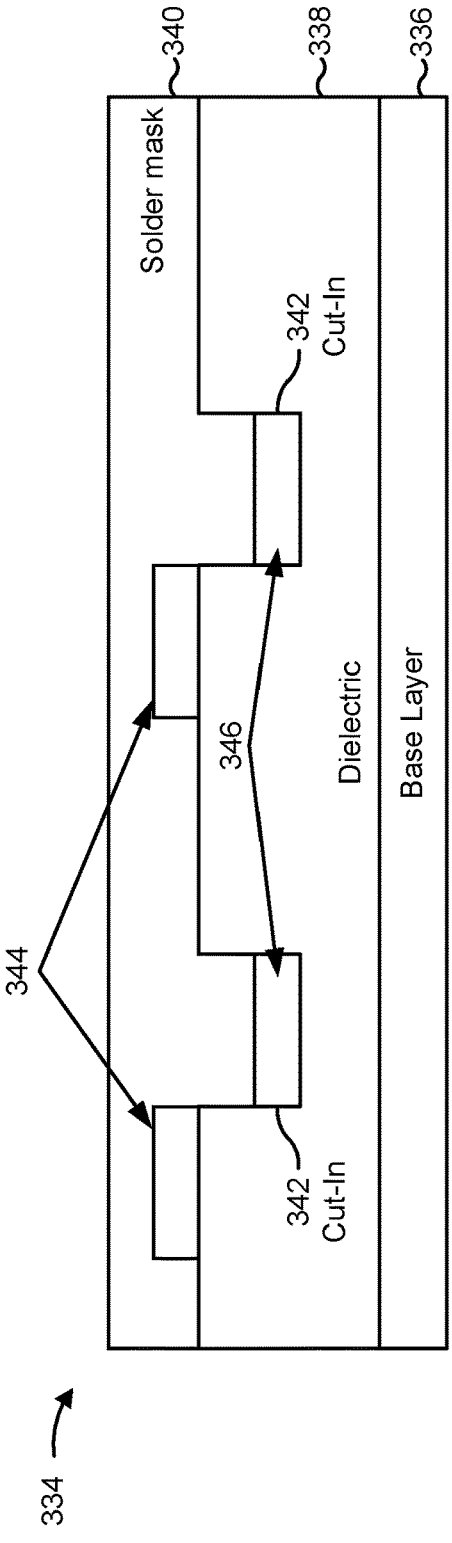
FIG. 3C

FIG. 3E

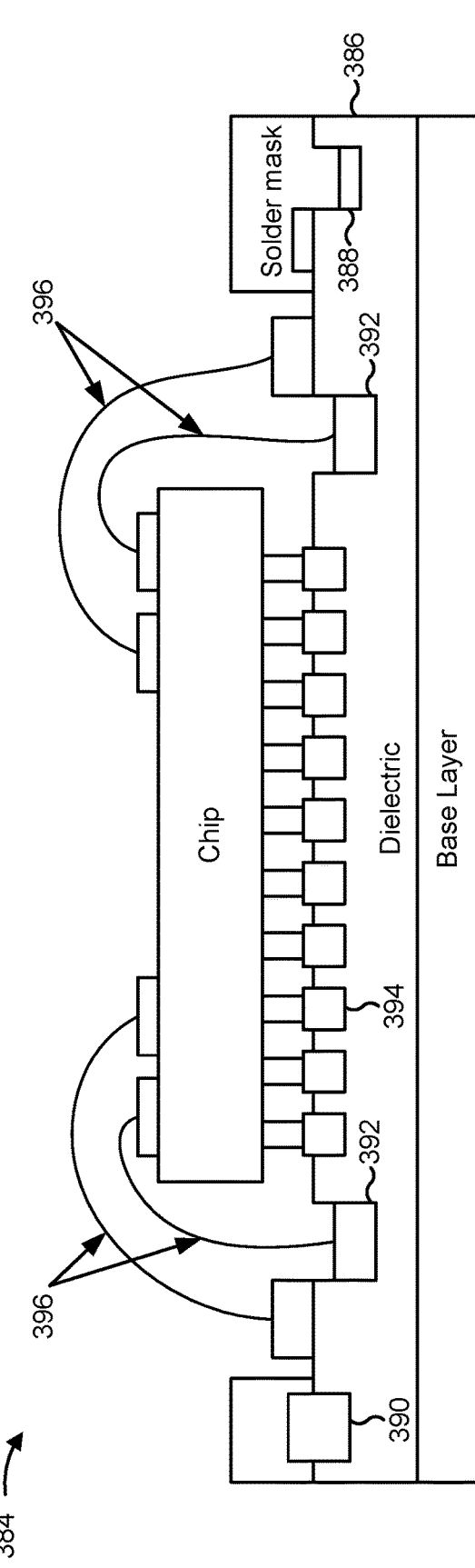
FIG. 3F

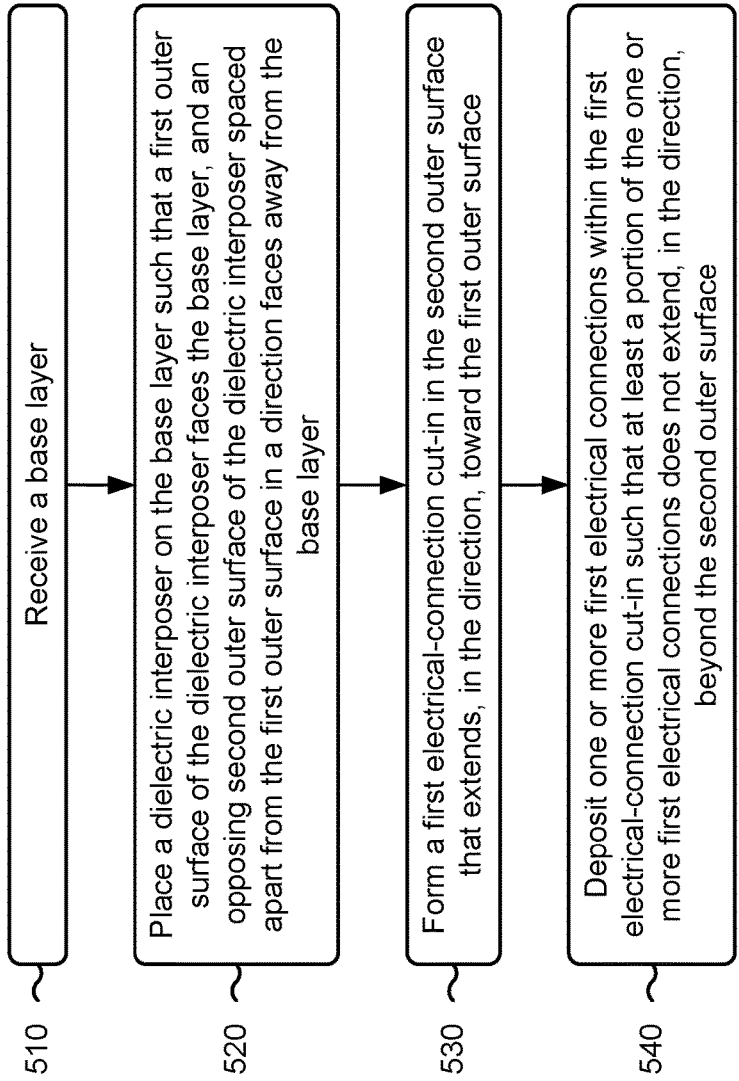

500

510    Receive a base layer

520    Place a dielectric interposer on the base layer such that a first outer surface of the dielectric interposer faces the base layer, and an opposing second outer surface of the dielectric interposer spaced apart from the first outer surface in a direction faces away from the base layer 530    Form a first electrical-connection cut-in in the second outer surface that extends, in the direction, toward the first outer surface 540    Deposit one or more first electrical connections within the first electrical-connection cut-in such that at least a portion of the one or more first electrical connections does not extend, in the direction, beyond the second outer surface

610 — Form a dielectric interposer having a first outer surface and an opposing second outer surface 620 — Cut an electrical-connection cut-in in the second outer surface that extends toward the first outer surface 630 — Deposit one or more first electrical connections within the electrical-connection cut-in

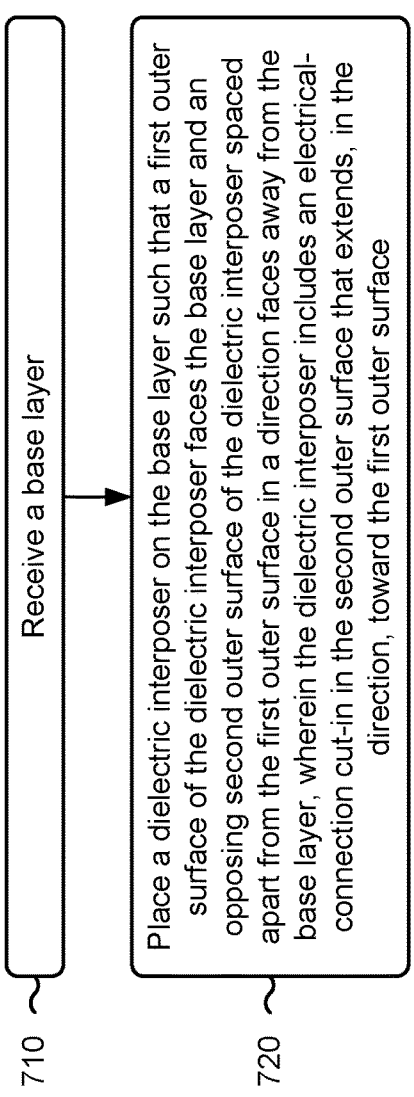

710    Receive a base layer

720    Place a dielectric interposer on the base layer such that a first outer surface of the dielectric interposer faces the base layer and an opposing second outer surface of the dielectric interposer spaced apart from the first outer surface in a direction faces away from the base layer, wherein the dielectric interposer includes an electrical-connection cut-in in the second outer surface that extends, in the direction, toward the first outer surface

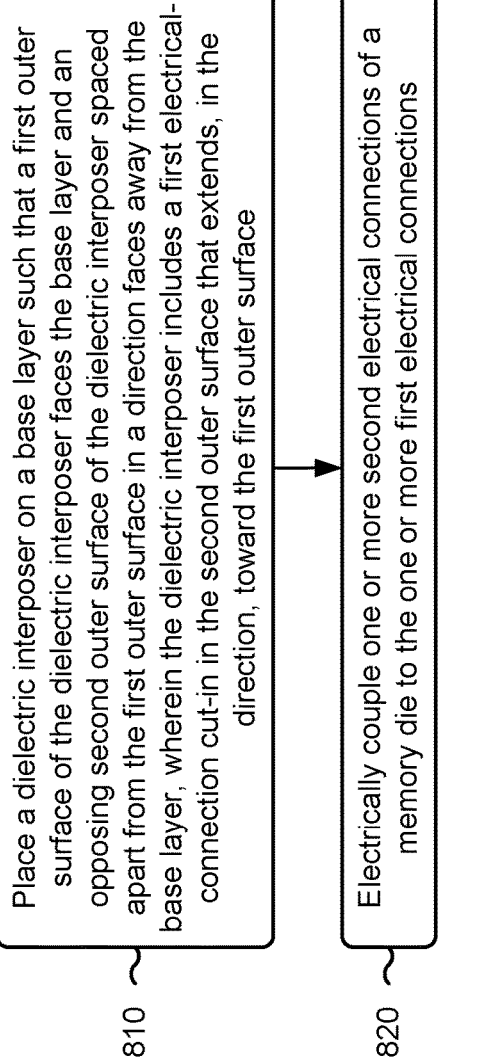

Place a dielectric interposer on a base layer such that a first outer surface of the dielectric interposer faces the base layer and an opposing second outer surface of the dielectric interposer spaced apart from the first outer surface in a direction faces away from the base layer, wherein the dielectric interposer includes a first electrical-connection cut-in in the second outer surface that extends, in the direction, toward the first outer surface

810

Electrically couple one or more second electrical connections of a memory die to the one or more first electrical connections

DIELECTRIC INTERPOSER WITH ELECTRICAL-CONNECTION CUT-IN

TECHNICAL FIELD

The present disclosure generally relates to semiconductor devices and methods of forming semiconductor devices. For example, the present disclosure relates to a dielectric interposer with an electrical-connection cut-in.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes means for connecting internal components to external components (e.g., a circuit board), such as via balls, pins, or leads. A semiconductor package is sometimes referred to as a semiconductor device assembly.

BRIEF DESCRIPTION OF THE DRAWINGS

FIGS. 3A-3F are diagrams of example apparatuses that include a dielectric interposer, according to some implementations of the disclosure.

FIG. 5 is a flowchart of an example method of forming an integrated assembly or memory device having a dielectric interposer with an electrical-connection cut-in.

FIG. 6 is a flowchart of an example method of forming an integrated assembly or memory device having a dielectric interposer with an electrical-connection cut-in.

FIG. 7 is a flowchart of an example method of forming an integrated assembly or memory device having a dielectric interposer with an electrical-connection cut-in.

FIG. 8 is a flowchart of an example method of forming an integrated assembly or memory device having a dielectric interposer with an electrical-connection cut-in.

DETAILED DESCRIPTION

Figure 1:
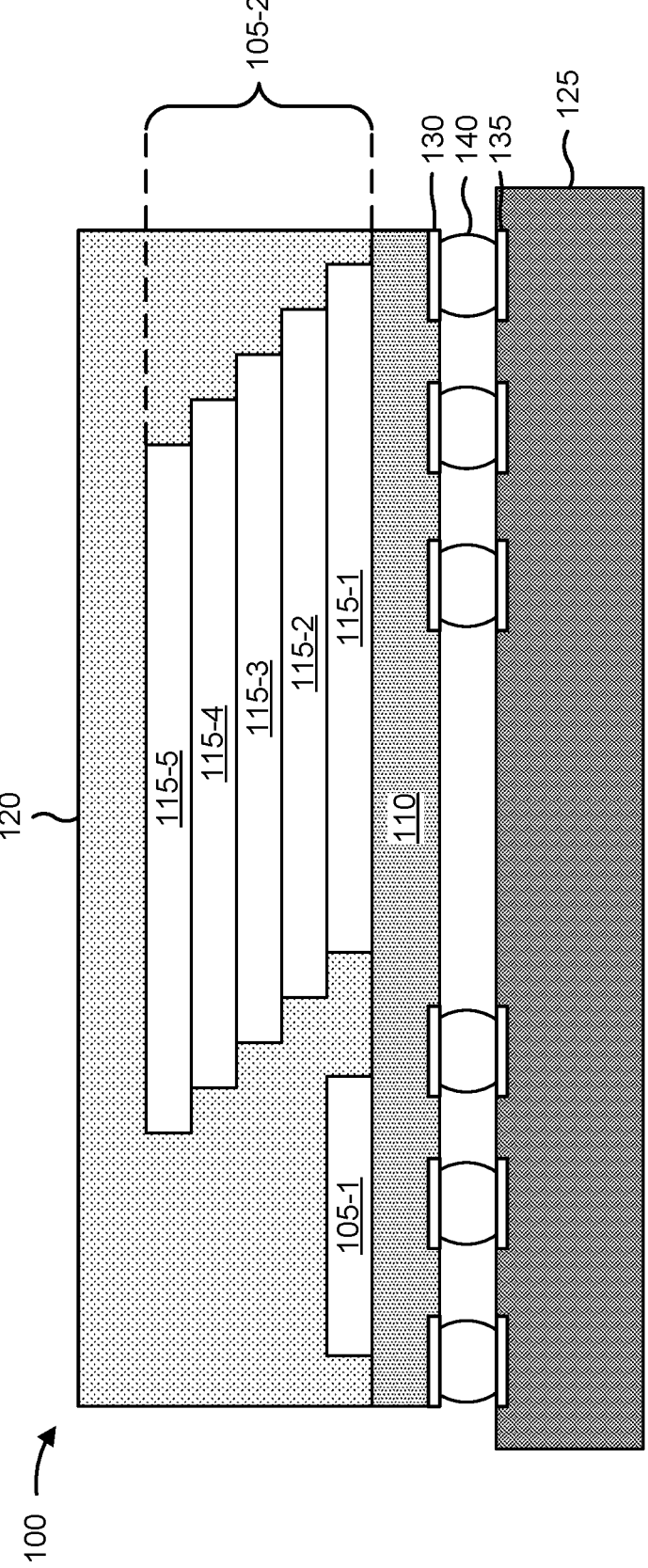
FIG. 1 is a diagram of an example apparatus that may be manufactured using techniques described herein.

Memory devices and similar components may include one or more semiconductor packages, also referred to as semiconductor device assemblies. At a high level, a semiconductor package may include one or more semiconductor devices, such as integrated circuits or similar components. A semiconductor device may include one or more semiconductor die electrically coupled to a substrate, such as a printed circuit board (PCB) or a similar substrate. A semiconductor die may be electrically coupled to a substrate (e.g., PCB) using wire bonding, bump bonding (sometimes referred to as direct chip attachment (DCA) bonding), or a similar bonding technique.

In some cases, a semiconductor package may include multiple layers, such as a base layer (sometimes referred to as a metal layer), an interposer disposed on the base layer, one or more electrical connections (e.g., signal traces, circuit traces, bond fingers, wire bond pads, bump bond pads, or similar electrical connections), a solder mask surrounding the one or more electrical connections and/or disposed proximate to the one or more electrical connections, and/or one or more semiconductor die or chips disposed on the interposer. In some examples, the interposer may include electrical insulation properties, and thus may be a dielectric interposer.

In some examples, a density of the electrical connections provided on the interposer may determine an impedance of the semiconductor package. Thus, in order to meet certain impedance specifications, the electrical connections may need to be routed further from each other in at least one of two dimensions (sometimes referred to as an x-dimension and ay-dimension), limiting a number of electrical connections that may be included on the dielectric interposer. Moreover, a thickness of the electrical connections in a third dimension (sometimes referred to a z-axis dimension), may be limited, providing minimal cross-sectional area for purposes of electrical conductivity. For example, some electrical connections may be used as a power bus (e.g., may be used as a common collector voltage ($V_{CC}$) or ground) for providing electrical connectivity to other components. In such cases, the amount of electrical connectivity may be limited due to the limited thickness of the power bus in the z-axis dimension. Additionally, the electrical connections may need to remain electrically isolated from one another (e.g., may need to be separated in the x-axis dimension and/or they-axis dimension), thus requiring a relatively large spacing (sometimes referred to as a pitch) between adjacent connections, limiting a number of electrical connections that may be included in a semiconductor package.

Some implementations described herein enable z-axis-dimension patterning of electrical connections in a semiconductor package by providing an electrical-connection cut-in within a dielectric interposer. The electrical-connection cut-in may be a trench or similar structure provided in an outer surface of the dielectric cut-in, in which a metal layer may be deposited to form an electrical connection, such as a trace, a bond finger, a wire bond pad, a bump bond pad, or a similar electrical connection. The electrical-connection cut-in provides an added dimension (e.g., the z-axis dimension) in which to locate electrical connections, thus improving impedance tuning associated with a semiconductor package. Additionally, or alternatively, the electrical-connection cut-in permits thicker (in the z-axis dimension) electrical connections, enabling improved electrical connectivity, such as improved power bussing or the like. Additionally, or alternatively, the electrical-connection cut-in enables tighter routing of traces or similar electrical connections, resulting in improved routing density within the semiconductor package. Additionally, or alternatively, the electrical-connection cut-in enables finer interconnect pitches for wire bond and/or DCA bonding, resulting in increased bond connections between the electrical connections and a semiconductor die or a similar semiconductor component. These and other benefits may be readily understood with reference to the accompanying drawings.

FIG. 1 is a diagram of an example apparatus 100 that may be manufactured using techniques described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a holographic RAM (HRAM) device, a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, a ROM device, or a HRAM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
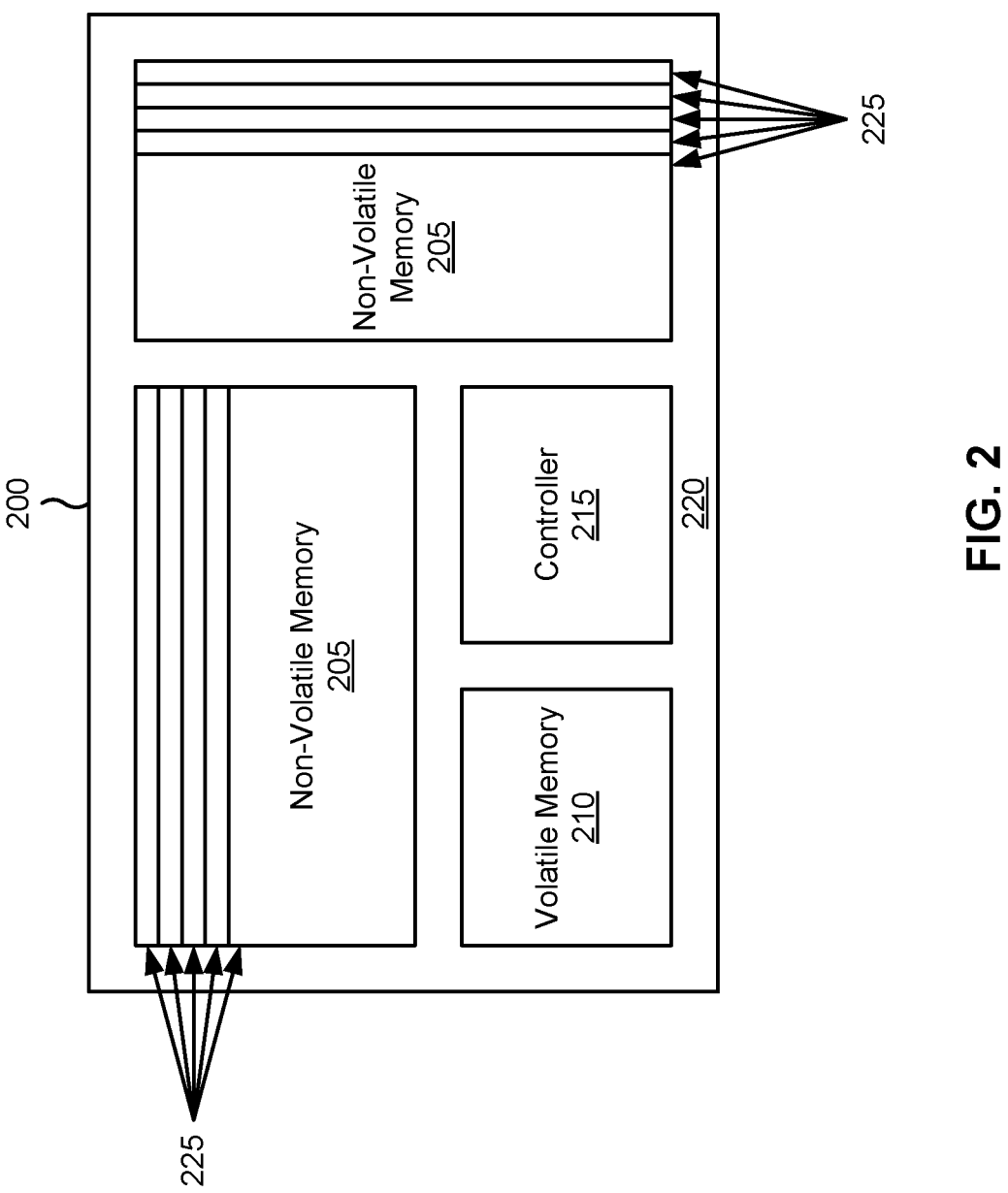
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

FIGS. 3A-3F are diagrams of example apparatuses that include a dielectric interposer, according to some implementations of the disclosure. In some implementations, the example apparatuses may be semiconductor packages, memory devices, or similar devices, such as one of the semiconductor packages and/or memory devices described above in connection with FIGS. 1 and 2.

Figure 3A:

As shown in FIG. 3A, a first apparatus 300 may include a dielectric interposer without an electrical-connection cut-in. More particularly, the apparatus 300 may include a base layer 302 (e.g., a metal layer), a dielectric interposer 304 disposed on top (in the z-axis direction) of the base layer 302, and one or more electrical connections disposed on top of the dielectric interposer 304, including, in the depicted example, one or more first electrical connections 306 and one or more second electrical connections 308. The electrical connections 306, 308 may be formed from a metallic and/or conductive material, such as gold, copper, or a similar material, and may be used to conduct electricity through the first apparatus 300 (e.g., in this example, the electrical connections may be signal traces or similar connections used to convey signals throughout the first apparatus 300). In some implementations, the electrical connections 306, 308 may be protected or otherwise covered by a protective layer, such as a solder mask 310 shown in FIG. 3A. The solder mask 310 may be a layer of polymer or similar material applied to the electrical connections 306, 308 (e.g., copper traces) for protection against oxidation and/or to prevent solder bridges from forming between the electrical connections 306, 308, among other benefits.

In this implementation, the dielectric interposer 304 of the first apparatus 300 does not include an electrical-connection cut-in. Put another way, as shown in FIG. 3A, the dielectric interposer 304 has a substantially uniform thickness in the z-axis direction. Accordingly the one or more first electrical connections 306 and the one or more second electrical connections 308 may be disposed on an outer surface of the of the dielectric interposer 304 and/or may be disposed at a same elevation in the z-axis direction. More particularly, the one or more first electrical connections 306 may be disposed at an elevation $Z_0$, and the one or more second electrical connections 308 may be disposed at an elevation $Z_0$, with $Z_0 = Z_1$. In this regard, impedance tuning of the first apparatus 300 may be limited to two dimensions: the x-axis dimension as shown in FIG. 3A, and a y-axis dimension, which may be substantially perpendicular to the x-axis dimension and a z-axis dimension shown in FIG. 3A. More particularly, an impedance of the first apparatus 300 may be associated with a relative distance between adjacent electrical connections 306, 308 (e.g., signal traces) in the first apparatus 300. Because, in this example, the one or more first electrical connections 306 and the one or more second electrical connections 308 are disposed at the same elevation (e.g., the same z-axis location), any impedance tuning may accomplished only by moving relative locations of the electrical connections 306, 308 in two dimensions (e.g., the x-axis dimension and/or the y-axis dimension). This may limit flexibility of where each electrical connection 306, 308 may be located and/or may limit routing density of electrical connections 306, 308 within the first apparatus 300.

In some implementations, as shown in connection with a second apparatus 312 in FIG. 3A, an apparatus may include a dielectric interposer with an electrical-connection cut-in, which may improve impedance tuning of the apparatus, among other benefits. More particularly, the second apparatus 312 may include a base layer 314 and a solder mask 316, which may be substantially similar to the base layer 302 and the solder mask 310 described above in connection with the first apparatus 300. The second apparatus 312 may also include a dielectric interposer 318 disposed between (in the z-axis direction) the base layer 314 and the solder mask 316. Unlike the dielectric interposer 304 described above in connection with the first apparatus 300, the dielectric interposer 318 of the second apparatus 312 may include an electrical-connection cut-in 320 provided in an outer surface of the dielectric interposer 318. In some implementations, the electrical-connection cut-in 320 may be a trench or similar relief etched into a surface of the dielectric interposer 318. More particularly, in some implementations, the dielectric interposer 318 may be coupled to the base layer 314 and may include a first outer surface 322 facing the base layer 314 and an opposing second outer surface 324 facing away from the base layer 314 (e.g., facing the solder mask 316) and spaced apart from the first outer surface 322 in the z-axis direction. In such implementations, the electrical-connection cut-in 320 may be provided in the second outer surface 324 and may extend, in the z-axis direction, toward the first outer surface 322.

In some implementations, one or more electrical connections associated with the second apparatus 312 may be disposed within the electrical-connection cut-in 320. For example, similar to the one or more first electrical connections 306 and the one or more second electrical connections 308 described above in connection with the first apparatus 300, the second apparatus 312 may include one or more first electrical connections 326 and one or more second electrical connections 328. In this implementation, the one or more first electrical connections 326 may be disposed on an outer surface of the dielectric interposer 318 (e.g., the second outer surface 324), and thus may be disposed in a similar location to the one or more first electrical connections 306 described above in connection with the first apparatus 300. The one or more second electrical connections 328, however, may be disposed at a different elevation (e.g., a different location in the z-axis direction) than the one or more first electrical connections 326. More particularly, the one or more second electrical connections 328 may be disposed within the electrical-connection cut-in 320. For example, in some implementations, the electrical-connection cut-in 320 may be a trench etched in the second outer surface 324 of the dielectric interposer 318, and the one or more second electrical connections 328 may be created via a metallization process that forms a metal layer within the trench serving as the one or more second electrical connections 328.

Unlike the first apparatus 300, in which an elevation of the one or more first electrical connections 306 (e.g., $Z_0$) is equal to an elevation of the one or more second electrical connections 308 (e.g., $Z_1$), in this implementation an elevation of the one or more first electrical connections 326 is not equal to an elevation of the one or more second electrical connections 328 (e.g., $Z_0 \neq Z_1$). Put another way, unlike the one or more first electrical connections 326, which are disposed on the second outer surface 324 of the dielectric interposer 318 and thus entirely extend beyond the second outer surface 324 of the dielectric interposer 318, at least a portion of the one or more second electrical connections 328 do not extend, in the z-axis direction, beyond the second outer surface 324. More particularly, in the implementation shown in FIG. 3A, no portion of the one or more second electrical connections 328 extends, in the z-axis direction, beyond the second outer surface 324. In this way, the second apparatus 312 may be associated with improved impedance tuning as compared to the first apparatus 300. This is because using the electrical-connection cut-in 320 to house at least some electrical connections (e.g., the one or more second electrical connections 328) in the second apparatus 312 provides three dimensions for locating the various electrical connections (e.g., traces) of the second apparatus 312 (corresponding to the x-axis dimension, the y-axis dimension, and the z-axis dimension), thereby improving flexibility of where each electrical connection 326, 328 may be located and/or increasing routing density of electrical connections 326, 328 within the second apparatus 312.

Additionally, or alternatively, the electrical-connection cut-in 320 of the dielectric interposer 318 may enable increased thicknesses (e.g., in the z-axis direction) of any electrical connections disposed therein, thereby improving bussing properties of the electrical connections. This may be more readily understood with reference to FIG. 3B, which depicts a third apparatus 330 according to some implementations of the disclosure. The third apparatus 330 may include the base layer 314, the solder mask 316, the dielectric interposer 318 with the electrical-connection cut-in 320, and the one or more first electrical connections 326 as described above in connection with the second apparatus 312. In this implementation, however, the third apparatus 330 includes one or more second electrical connections 332 within the electrical-connection cut-in 320 that extend beyond the second outer surface of the dielectric interposer 318. More particularly, in the second apparatus 312, a dimension, in the z-axis direction, of the one or more second electrical connections 328 is substantially equal to a corresponding dimension, in the z-axis direction, of the one or more first electrical connections 326. However, in the third apparatus 330, a dimension, in the z-axis direction, of the one or more second electrical connections 332 is greater than a corresponding dimension, in the z-axis direction, of the one or more first electrical connections 326. Put another way, the one or more first electrical connections 326 and the one or more second electrical connections 332 may extend, in the z-axis direction, a same distance past the second outer surface 324, but because the one or more first electrical connections 326 are disposed on the second outer surface 324 and the one or more second electrical connections 332 are disposed within the electrical-connection cut-in 320, the one or more second electrical connections 332 are thicker in the z-axis direction.

In this way, the electrical-connection cut-in 320 of the third apparatus 330 may enable improved power bussing as compared to the first apparatus 300. For example, the one or more second electrical connections 332 may form part of a power supply associated with the third apparatus 330. For example, the one or more second electrical connections 332 may be used to provide a $V_{CC}$ and/or a ground (Gnd) connection as part of a power supply associated with the third apparatus 330. The increased thickness, in the z-axis direction, of the one or more second electrical connections 332 (as compared to one or more second electrical connections 308 of the first apparatus 300) may result in increased conductivity and/or cross-sectional area of the power supply connections, thereby improving power bussing capabilities of the one or more second electrical connections 328.

In the implementations shown in FIGS. 3A and 3B, the electrical connections are spaced apart from one another, in the x-axis direction. This may be in order to prevent solder bridging, current jumping, or similar interaction between adjacent electrical connections. In some implementations, however, use of a cut-in (e.g., the electrical-connection cut-in 320) may enable adjacent electrical connections to be disposed nearer to one another in the x-axis direction and/or the y-axis direction, such as for purposes of improving routing density of electrical connections within an apparatus (e.g., a semiconductor device, a memory device, or a similar apparatus), or the like. This may be more readily understood with reference to FIG. 3C.

More particularly, FIG. 3C shows a fourth apparatus 334 that may include a base layer 336, a dielectric interposer 338, and a solder mask 340, which may be substantially similar the like-named components described above in connection with the third apparatus 330. Moreover, the dielectric interposer 338 may include an electrical-connection cut-in 342, which may be substantially similar to the electric-connection cut-in 320 described above in connection with the third apparatus 330. In this implementation, however, the electrical-connection cut-in 342 is disposed within the dielectric interposer 338 in such a way that neighboring electrical connections may be located, in the x-axis direction and/or the y-axis direction, nearer to one another than neighboring electrical connections of the third apparatus 330.

More particularly, the fourth apparatus 334 may include one or more first electrical connections 344 and one or more second electrical connections 346, which may be substantially similar to the electrical connections 306, 308, 326, 328 described above in connection with FIGS. 3A and 3B. In this implementation, each electrical connection of the one or more first electrical connections 344 is disposed proximate to, in the x-axis direction, a corresponding electrical connection of the one or more second electrical connections 346. More particularly, in the depicted implementation, there is no x-axis spacing between each electrical connection of the one or more first electrical connections 344 and a corresponding electrical connection of the one or more second electrical connections 346. In some implementations, placing a first electrical connection (e.g., an electrical connection of the one or more first electrical connections 344) proximate to a second electrical connection (e.g., an electrical connection of the one or more second electrical connections 346) with little or no horizontal spacing (e.g., little or no spacing in the x-axis direction or the or the y-axis direction) may be referred to as "differential pair coupling." In some implementations, the electrical connection cut-in 342 may enable differential pair coupling, because even though the first and second electrical connections are proximate to one another in the horizontal direction, the electrical connections may nonetheless be sufficiently isolated from one another because the electrical connections are separated from one another in the vertical direction as shown in FIG. 3C, thus reducing the risk of prevent solder bridging, current jumping, or similar interaction between adjacent electrical connections. Accordingly, differential pair coupling may enable tighter routing density within the fourth apparatus 334, thereby enabling more electrical connections per unit area and/or enabling reduced size semiconductor packages, among other benefits.

Although the examples described in connection with FIGS. 3A-3C include signal traces or similar electrical connections associated with an electrical-connection cut-in in order to improve impedance tuning, improve power bussing, and/or increase routing density, among other benefits, aspects of the disclosure are not so limited. In some other implementations, other types of electrical connections may be utilized in connection with an electrical-connection cut-in in order to realize similar benefits as described above. For example, FIGS. 3D-3E show implementations in which electrical connections that are associated with an interconnect interface (e.g., bond pads or similar electrical connections) are associated with a dielectric cut-in, such as for purposes of providing a tighter bond pad pitch, improved electrical insulation between bond pads, or the like.

Figure 3D:

More particularly, FIG. 3D shows a fifth apparatus 348 according to some implementations. The fifth apparatus 348 may include a base layer 350, a dielectric interposer 352, and a solder mask 354, which may be substantially similar to one or more of the like-named components described above in connection with FIGS. 3A-3C. In this implementation, however, the solder mask 354 may expose certain electrical connections, such as bond pads or similar connections capable of making an electrical connection with another device, such as a microcontroller, a semiconductor die (e.g., a memory die), an integrated circuit, or a similar device. More particularly, the fifth apparatus 348 may include multiple electrical connections 356, which may be bond pads for connecting the fifth apparatus 348 to a semiconductor die or similar device. In some implementations, the electrical connections 356 may be wire bond pads, bump bond pads, or similar pads. Each electrical connection 356 may be separated from a neighboring electrical connection 356 in the horizontal direction (e.g., the x-axis direction or the y-axis direction) by at least a minimum distance so that the electrical connections 356 are sufficiently electrically isolated from each other. For example, as shown in FIG. 3D, each electrical connection 356 is separated from a neighboring electrical connection 356 by a distance X, sometimes referred to as an interconnect pitch or simply a pitch. In that regard, a total number of electrical connections 356 that may be included on the fifth apparatus 348 may be limited, because each electrical connection must maintain an envelope around the electrical connection 356 (corresponding to the interconnect pitch) in which no other electrical connections 356 are provided.

In contrast, a sixth apparatus 358 shown in FIG. 3D includes a dielectric cut-in, which, in a similar manner as described in connection with the fourth apparatus 334 of FIG. 3C, permits electrical connections to be disposed closer to one another in the horizontal direction (e.g., the x-axis direction or the y-axis direction), enabling a tighter interconnect pitch than an interconnect pitch that is associated with the electrical connections 356 of the fifth apparatus 348. More particularly, the sixth apparatus 358 may include the base layer 350 and the solder mask 354, which may be substantially similar to fifth apparatus 348. In this implementation, however, the sixth apparatus 358 includes a dielectric interposer 360 including an electrical-connection cut-in 362, which may be substantially similar to one or more of the electrical-connection cut-ins described in connection with FIGS. 3A-3C. The electrical-connection cut-in 362 may house one or more of the electrical connections 356, thereby staggering the electrical connections 356 in the vertical direction (e.g., the z-axis direction), as shown. As a result, and as shown in FIG. 3C, the electrical connections 356 (e.g., wire bond pads) may be disposed closer to one another in the horizontal direction (e.g., the x-axis direction or the y-axis direction), thereby enabling a tighter interconnect pitch and thus more electrical connections 356 per surface area of the dielectric interposer 360.

In some implementations, the electrical connections 356 of the sixth apparatus 358 may be wire bond pads used for wire bonding a semiconductor die to the apparatus. In some other implementations, a dielectric cut-in may be associated with bump bond connections, such as for purposes of DCA or a similar bump bonding connection technique. For example, FIG. 3E shows a seventh apparatus 364 in which a dielectric interposer may be implemented in connection with bump bonding (e.g., DCA bonding). More particularly, the seventh apparatus 364 includes a base layer 366, a dielectric interposer 368, and a solder mask 370, which may be substantially similar to like-named components described above in connection with FIGS. 3A-3D. The seventh apparatus 364 may also include multiple electrical connections 372, which, in some implementations, may be bump bond pads configured to receive and/or bond to bump bonds (e.g., solder bumps) of a chip, die, or similar component via a bump bonding (e.g., DCA) process. For example, the seventh apparatus 364 may also include a chip 374, which may be a flip-chip or similar integrated circuit, microcontroller, semiconductor die, or the like. The chip 374 may include a multiple electrical connections 376, which may be solder bumps or similar connections, which align with the electrical connections 372 and join (e.g., solder) thereto, thereby creating an electrical interface between components of the seventh apparatus 364.

In some implementations, soldering the electrical connections 372 to the electrical connections 376 may inadvertently create a solder bridge between neighboring electrical connections 372, 376, thereby resulting in faulty electrical interfaces or similar failure. Moreover, when neighboring electrical connections 372, 376 are not sufficiently electrically isolated from one another, charges from one electrical connection 372, 376 may jump to nearby electrical connections 372, 376, resulting in faulty performance of the seventh apparatus 364. Accordingly, in some implementations, a dielectric cut-in may be utilized to provide electrical isolation between neighboring electrical connections 372, thereby resulting in improved connectivity and thus device performance.

More particularly, as further shown in FIG. 3E, an eighth apparatus 378 may include a dielectric interposer including an electrical-connection cut-in 382 in order to provide increased electrical isolation of bump bond pads or similar electrical connections, among other benefits. More particularly, the eighth apparatus 378 may include the base layer 366 and the solder mask 370, in a similar manner to the seventh apparatus 364. In this implementation, however, the eighth apparatus 378 includes a dielectric interposer 380 that includes the electrical-connection cut-in 382, which may be similar to one or more of the electrical-connection cut-ins described above in connection with FIGS. 3A-3D. Moreover, the electrical connections 372 (e.g., the bump bond pads) may be at least partially disposed within the electrical-connection cut-in 382. In this way, the dielectric interposer 380 may serve to electrically isolate the electrical connections 372 from one another, thereby providing more robust connectivity.

Although the various implementations of the electrical-connection cut-ins described in connection with FIGS. 3A-3E are shown and described in insolation, in some other implementations, two or more electrical-connection cut-ins may be implemented in a single device without departing from the scope of the disclosure. In one illustrative example, an apparatus may include an electrical-connection cut-in associated with wire bonding, and another electrical-connection cut-in associated with bump bonding. More particularly, an apparatus may include both a first electrical-connection cut-in in a second outer surface of a dielectric interposer that extends, in the z-axis direction, toward the first outer surface of the dielectric interposer, and a second electrical-connection cut-in in the second outer surface that extends, in the z-axis direction, toward the first outer surface. In such implementations, one or more first electrical connections may be disposed within the first electrical-connection cut-in such that at least a portion of the one or more first electrical connections do not extend, in the z-axis direction, beyond the second outer surface, and one or more second electrical connections may be disposed within the second electrical-connection cut-in such that at least a portion of the one or more second electrical connections do not extend, in the z-axis direction, beyond the second outer surface. The one or more first electrical connections may be associated with one of wire bond connections or bump bond connections, and the one or more second electrical connections may be associated with the other one of the wire bond connections or the bump bond connections.

More particularly, FIG. 3F shows a ninth apparatus 384 that includes a dielectric interposer 386 including multiple electrical-connection cut-ins, among other components described in detail above (e.g., a base layer, a solder mask, a chip, or similar components, which are not described again in detail). In this implementation, the dielectric interposer 386 includes a first electrical-connection cut-in 388, a second electrical-connection cut-in 390, a third electrical-connection cut-in 392, and a fourth electrical-connection cut-in 394. The first electrical-connection cut-in 388 may enable z-axis direction patterning of traces within the ninth apparatus, such as for purposes of impedance tuning, tight trace routing, and/or differential pair coupling, as described in detail in connection with FIGS. 3A and 3C. The second electrical-connection cut-in 390 may enable thicker traces within the ninth apparatus 384, such as for purposes of improved power bussing, as described in detail in connection with FIG. 3B. The third electrical-connection cut-in 392 may enable tight bond pad pitches, such as for purposes of providing increased wire bonding (as shown via wire bonds 396 in FIG. 3F), as described in detail in connection with FIG. 3D. And the fourth electrical-connection cut-in 394 may enable improved bond pad electrical isolation, such as for purposes of connecting a chip to the ninth apparatus 384 using a DCA bond, as described in detail in connection with FIG. 3E.

The illustrated x-axis and z-axis are substantially perpendicular to one another, and each of the x-axis and z-axis may be substantially perpendicular to they-axis (not shown but described herein). In other words, the x-axis is substantially perpendicular to they-axis and the z-axis, they-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

As indicated above, FIGS. 3A-3F are provided as examples. Other examples may differ from what is described with respect to FIGS. 3A-3F.

Figure 4:
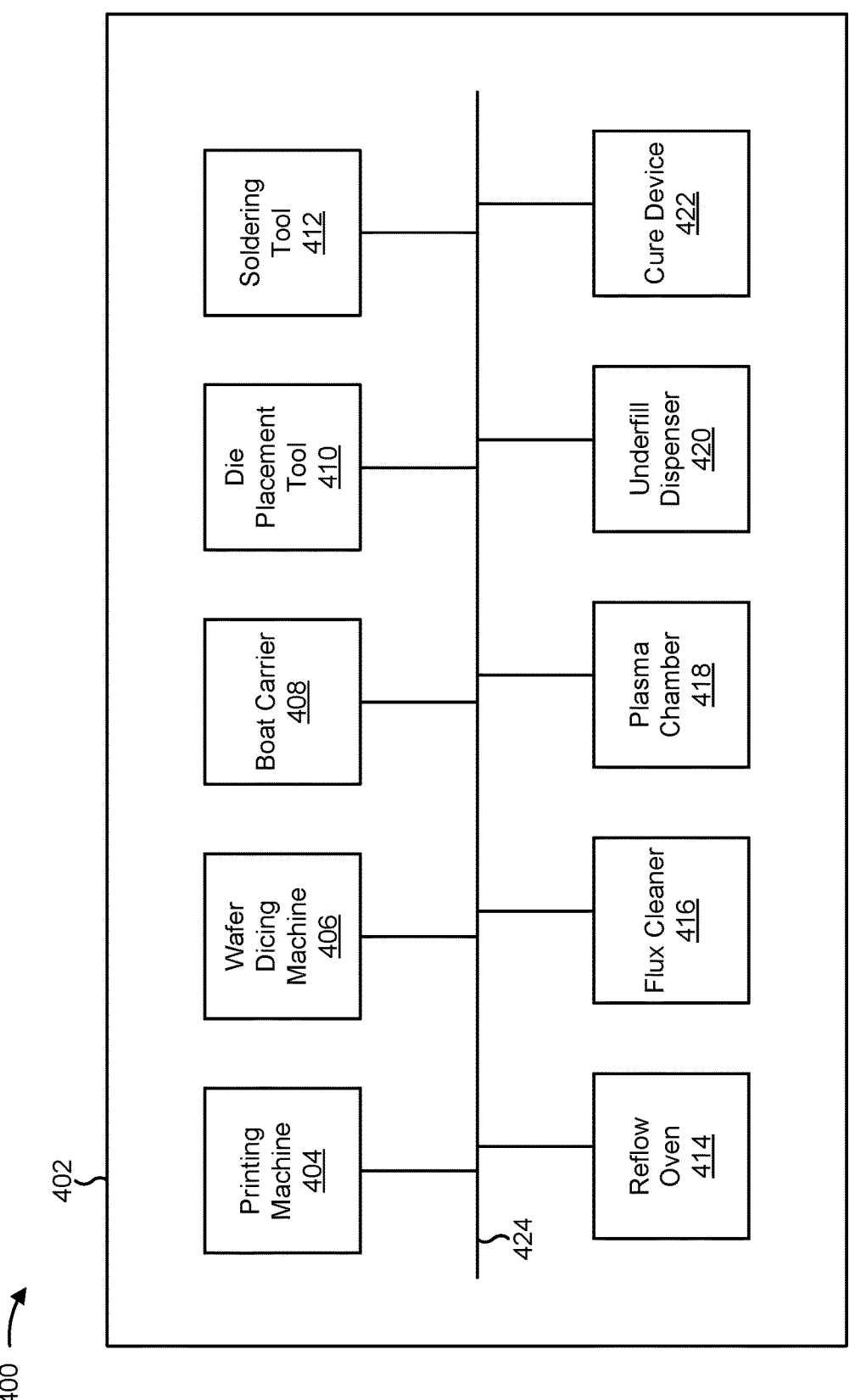
FIG. 4 is a diagram of example equipment used to manufacture various semiconductor packages, memory devices, or similar components described herein.

FIG. 4 is a diagram of example equipment 400 used to manufacture various semiconductor packages, memory devices, or similar components described herein. As shown in FIG. 4, the equipment 400 may include a packaging system 402, such as for manufacturing a semiconductor package (e.g., one of the apparatuses described in connection with FIGS. 3A-3F). The packaging system 402 may include one or more devices or tooling, such as a printing machine 404, a wafer dicing machine 406, a boat carrier 408, a die placement tool 410, a soldering tool 412, a reflow oven 414, a flux cleaner 416, a plasma chamber 418, an underfill dispenser 420, and/or a cure device 422. One or more devices may be may physically or communicatively coupled to one another. For example, one or more devices may interconnect via wired connections and/or wireless connections, such as via a bus 424. Additionally, or alternatively, one or more devices may form part of an electronics assembly manufacturing line.

The printing machine 404 may be a device capable of printing patterns in a material such as silicon, a dielectric material (e.g., a material used to form one or more of the dielectric interposers described above), or a similar material, for purposes of forming an integrated circuit or the like. In some implementations, the printing machine 404 may be a lithography device capable of printing patterns in a material to form an integrated circuit. Additionally, or alternatively, the printing machine 404 may be capable of applying solder or other electrically conductive material to form a portion of an electrical connection to be formed between a die and a substrate. For example, the printing machine 404 may be capable of applying a grid of solder bumps to a die, which will align with a grid of bump pads on a substrate during a flip chip attachment process, or the like.

The wafer dicing machine 406 may be a device capable of dicing a die, such as a microcontroller, a memory die, or other semiconductor die, from a wafer. In some implementations, the wafer dicing machine 406 may include one or more blades and/or one or more lasers to dice the flip chip die from the wafer.

The boat carrier 408 may be a device capable of supporting and/or carrying a substrate during a die and/or chip attachment process. The boat carrier 408 may be constructed from a non-contaminating material, such as quartz, and may be capable of withstanding high temperatures. In that regard, the boat carrier 408 may be capable of carrying a substrate and/or one or more die through one or more ovens, such as a reflow oven 414 and/or a cure device 422.

The die placement tool 410 may be a high-precision tool capable of placing a die onto a substrate. In some implementations, the die placement tool 412 may be capable of flipping a flip chip die during a placement process, such that an active surface of the flip chip die, which may be facing up during preliminary manufacturing steps, may face the substrate during the flip chip die placement process. In some implementations, the die placement tool 410 may include one or more sensors capable of aligning bump bonds on a die with bond pads on a substrate during a flip chip die attachment process.

The soldering tool 412 may be capable of forming one or more solder connections between components of a semiconductor package. For example, the soldering tool 412 may be capable of forming wire bond connections between components of a semiconductor package by soldering wires connecting wire bond bands from one component to wire bond pads of another component. In some implementations, the soldering tool may be capable of applying a solder mask over one or more electrical connections and/or solder joints.

The reflow oven 414 may be capable of heating components to a suitable temperature to cause a reflow of solder or other bonding material, thereby causing the solder or similar material to melt and make an electrical connection between two components.

The flux cleaner 416 may be a device capable of removing residual flux from a soldering process. In some implementations, the flux cleaner 416 may include a heater capable of removing residual flux through a heat treatment process. Additionally, or alternatively, the flux cleaner 416 may include a nozzle or similar device capable of applying a cleaning agent to a component a die attachment process in order to remove residual flux therefrom.

The plasma chamber 418 may be a device capable of providing plasma treatment to component. In some implementations, the plasma chamber 418 may be capable of directly or indirectly applying a plasma stream to an area of a component, such as for purposes of preparing the area on the component for receiving an epoxy underfill, or the like.

The underfill dispenser 420 may be a device capable of dispensing an epoxy underfill between a die and a substrate, or the like. In some implementations, the underfill dispenser 420 may include a dispensing needle capable of applying an epoxy underfill by capillary action under pressure, such as by dispensing underfill material around a periphery of a die such that the underfill material flows beneath the die and fills a space between the die and substrate.

The cure device 422 may be a device capable of curing an underfill material, such as an epoxy underfill material. In some implementations, the cure device 422 may be an oven configured to heat an underfill material to a suitable curing temperature. Additionally, or alternatively, the cure device 422 may be capable of curing the underfill material via a chemical reaction, by the application of ultraviolet light, by the application of other radiation, or the like.

The number and arrangement of devices and networks shown in FIG. 4 are provided as an example. In practice, there may be additional devices, fewer devices, different devices, or differently arranged devices than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of equipment 400 may perform one or more functions described as being performed by another set of devices of equipment 400.

FIG. 5 is a flowchart of an example method 500 of forming an integrated assembly or memory device having a dielectric interposer with an electrical-connection cut-in. In some implementations, one or more process blocks of FIG. 5 may be performed by various semiconductor manufacturing equipment, such as the equipment described in connection with FIG. 4, among other examples.

As shown in FIG. 5, the method 500 may include receiving a base layer (block 510). As further shown in FIG. 5, the method 500 may include placing a dielectric interposer on the base layer such that a first outer surface of the dielectric interposer faces the base layer, and an opposing second outer surface of the dielectric interposer spaced apart from the first outer surface in a direction faces away from the base layer (block 520). As further shown in FIG. 5, the method 500 may include forming a first electrical-connection cut-in in the second outer surface that extends, in the direction, toward the first outer surface (block 530). As further shown in FIG. 5, the method 500 may include depositing one or more first electrical connections within the first electrical-connection cut-in such that at least a portion of the one or more first electrical connections does not extend, in the direction, beyond the second outer surface (block 540).

The method 500 may include additional aspects, such as any single aspect or any combination of aspects described below and/or in connection with one or more other methods described elsewhere herein.

In a first aspect, the method 500 includes placing a memory die on the dielectric interposer, and electrically coupling one or more second electrical connections of the memory die to the one or more first electrical connections.

In a second aspect, alone or in combination with the first aspect, depositing the one or more first electrical connections within the first electrical-connection cut-in includes depositing the one or more first electrical connections such that no portion of the one or more first electrical connections extends, in the direction, beyond the second outer surface.

In a third aspect, alone or in combination with one or more of the first and second aspects, the method 500 includes depositing one or more second electrical connections on the second outer surface.

In a fourth aspect, alone or in combination with one or more of the first through third aspects, a dimension, in the direction, of the one or more first electrical connections is substantially equal to a corresponding dimension, in the direction, of the one or more second electrical connections.

In a fifth aspect, alone or in combination with one or more of the first through fourth aspects, a dimension, in the direction, of the one or more first electrical connections is greater than a corresponding dimension, in the direction, of the one or more second electrical connections.

In a sixth aspect, alone or in combination with one or more of the first through fifth aspects, the one or more first electrical connections and the one or more second electrical connections extend, in the direction, a same distance past the second outer surface.

In a seventh aspect, alone or in combination with one or more of the first through sixth aspects, the method 500 includes forming a second electrical-connection cut-in in the second outer surface that extends, in the direction, toward the first outer surface, and depositing one or more second electrical connections within the second electrical-connection cut-in such that at least a portion of the one or more second electrical connections does not extend, in the direction, beyond the second outer surface, wherein the one or more first electrical connections are associated with one of wire bond connections or bump bond connections, and wherein the one or more second electrical connections are associated with the other one of the wire bond connections or the bump bond connections.

Although FIG. 5 shows example blocks of the method 500, in some implementations, the method 500 may include additional blocks, fewer blocks, different blocks, or differently arranged blocks than those depicted in FIG. 5. In some implementations, the method 500 may include forming one of the apparatuses 312, 330, 334, 358, 378, 384, an integrated assembly that includes one of the apparatuses 312, 330, 334, 358, 378, 384, any part described herein of one of the apparatuses 312, 330, 334, 358, 378, 384, and/or any part described herein of an integrated assembly that includes one of the apparatuses 312, 330, 334, 358, 378, 384. For example, the method 500 may include forming one or more of the dielectric interposers 318, 338, 360, 380, 386, and/or one or more of the electrical connections described in connection with the one or more of the dielectric interposers 318, 338, 360, 380, 386 (e.g., the electrical connections 326, 328, 332, 344, 346, 356, 372).

Figure 6:
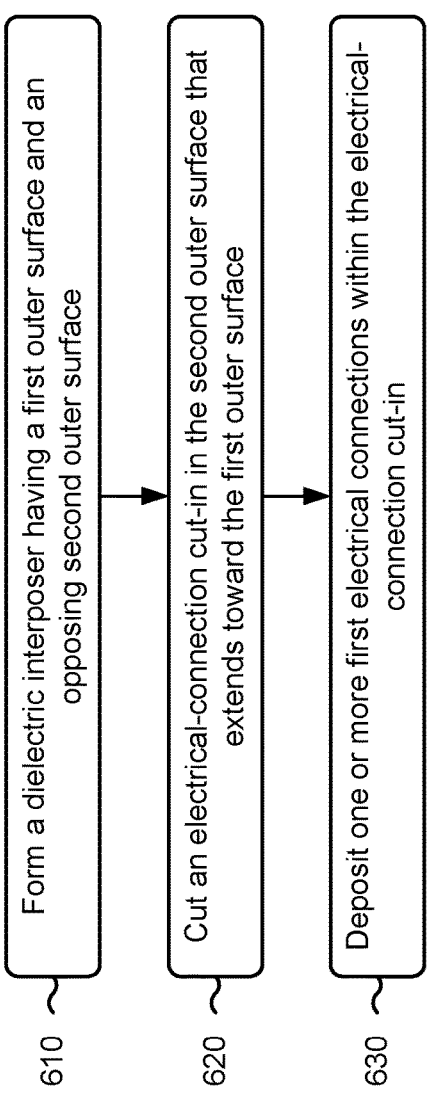

FIG. 6 is a flowchart of an example method 600 of forming an integrated assembly or memory device having a dielectric interposer with an electrical-connection cut-in. In some implementations, one or more process blocks of FIG. 6 may be performed by various semiconductor manufacturing equipment, such as the equipment described in connection with FIG. 4, among other examples.

As shown in FIG. 6, the method 600 may include forming a dielectric interposer having a first outer surface and an opposing second outer surface (block 610). As further shown in FIG. 6, the method 600 may include etching an electrical-connection cut-in in the second outer surface that extends toward the first outer surface (block 620). As further shown in FIG. 6, the method 600 may include depositing one or more first electrical connections within the first electrical-connection cut-in (block 630).

The method 600 may include additional aspects, such as any single aspect or any combination of aspects described below and/or in connection with one or more other methods described elsewhere herein.

In a first aspect, the method 600 includes receiving a base layer, placing the dielectric interposer on the base layer such that the first outer surface of the dielectric interposer faces the base layer the second outer surface faces away from the base layer, and depositing a solder mask on the second outer surface and over the one or more first electrical connections within the first electrical-connection cut-in.

In a second aspect, alone or in combination with the first aspect, the method 600 includes placing a memory die on the dielectric interposer, and electrically coupling one or more second electrical connections of the memory die to the one or more first electrical connections.

In a third aspect, alone or in combination with one or more of the first and second aspects, depositing the one or more first electrical connections within the first electrical-connection cut-in includes depositing the one or more first electrical connections such that no portion of the one or more first electrical connections extends beyond the second outer surface.

In a fourth aspect, alone or in combination with one or more of the first through third aspects, the method 600 includes depositing one or more second electrical connections on the second outer surface.

Although FIG. 6 shows example blocks of the method 600, in some implementations, the method 600 may include additional blocks, fewer blocks, different blocks, or differently arranged blocks than those depicted in FIG. 6. In some implementations, the method 600 may include forming one of the apparatuses 312, 330, 334, 358, 378, 384, an integrated assembly that includes one of the apparatuses 312, 330, 334, 358, 378, 384, any part described herein of one of the apparatuses 312, 330, 334, 358, 378, 384, and/or any part described herein of an integrated assembly that includes one of the apparatuses 312, 330, 334, 358, 378, 384. For example, the method 500 may include forming one or more of the dielectric interposers 318, 338, 360, 380, 386, and/or one or more of the electrical connections described in connection with the one or more of the dielectric interposers 318, 338, 360, 380, 386 (e.g., the electrical connections 326, 328, 332, 344, 346, 356, 372).

FIG. 7 is a flowchart of an example method 700 of forming an integrated assembly or memory device having a dielectric interposer with an electrical-connection cut-in. In some implementations, one or more process blocks of FIG. 7 may be performed by various semiconductor manufacturing equipment, such as the equipment described in connection with FIG. 4, among other examples.

As shown in FIG. 7, the method 700 may include receiving a base layer (block 710). As further shown in FIG. 7, the method 700 may include placing a dielectric interposer on the base layer such that a first outer surface of the dielectric interposer faces the base layer and an opposing second outer surface of the dielectric interposer spaced apart from the first outer surface in a direction faces away from the base layer, wherein the dielectric interposer includes an electrical-connection cut-in in the second outer surface that extends, in the direction, toward the first outer surface (block 720).

The method 700 may include additional aspects, such as any single aspect or any combination of aspects described below and/or in connection with one or more other methods described elsewhere herein.

Although FIG. 7 shows example blocks of the method 700, in some implementations, the method 700 may include additional blocks, fewer blocks, different blocks, or differently arranged blocks than those depicted in FIG. 7. In some implementations, the method 700 may include forming one of the apparatuses 312, 330, 334, 358, 378, 384, an integrated assembly that includes one of the apparatuses 312, 330, 334, 358, 378, 384, any part described herein of one of the apparatuses 312, 330, 334, 358, 378, 384, and/or any part described herein of an integrated assembly that includes one of the apparatuses 312, 330, 334, 358, 378, 384. For example, the method 500 may include forming one or more of the dielectric interposers 318, 338, 360, 380, 386, and/or one or more of the electrical connections described in connection with the one or more of the dielectric interposers 318, 338, 360, 380, 386 (e.g., the electrical connections 326, 328, 332, 344, 346, 356, 372).

FIG. 8 is a flowchart of an example method 800 of forming an integrated assembly or memory device having a dielectric interposer with an electrical-connection cut-in. In some implementations, one or more process blocks of FIG. 8 may be performed by various semiconductor manufacturing equipment, such as the equipment described in connection with FIG. 4, among other examples.

As shown in FIG. 8, the method 800 may include placing a dielectric interposer on a base layer such that a first outer surface of the dielectric interposer faces the base layer and an opposing second outer surface of the dielectric interposer spaced apart from the first outer surface in a direction faces away from the base layer, wherein the dielectric interposer includes a first electrical-connection cut-in in the second outer surface that extends, in the direction, toward the first outer surface (block 810). As further shown in FIG. 8, the method 800 may include electrically coupling one or more second electrical connections of a memory die to the one or more first electrical connections (block 820).

The method 800 may include additional aspects, such as any single aspect or any combination of aspects described below and/or in connection with one or more other methods described elsewhere herein.

Although FIG. 8 shows example blocks of the method 800, in some implementations, the method 800 may include additional blocks, fewer blocks, different blocks, or differently arranged blocks than those depicted in FIG. 8. In some implementations, the method 800 may include forming one of the apparatuses 312, 330, 334, 358, 378, 384, an integrated assembly that includes one of the apparatuses 312, 330, 334, 358, 378, 384, any part described herein of one of the apparatuses 312, 330, 334, 358, 378, 384, and/or any part described herein of an integrated assembly that includes one of the apparatuses 312, 330, 334, 358, 378, 384. For example, the method 500 may include forming one or more of the dielectric interposers 318, 338, 360, 380, 386, and/or one or more of the electrical connections described in connection with the one or more of the dielectric interposers

318, 338, 360, 380, 386 (e.g., the electrical connections 326, 328, 332, 344, 346, 356, 372).

In some implementations, a semiconductor device assembly includes a base layer; a dielectric interposer coupled to the base layer and including a first outer surface facing the base layer and an opposing second outer surface facing away from the base layer and spaced apart from the first outer surface in a direction; a first electrical-connection cut-in in the second outer surface that extends, in the direction, toward the first outer surface; and one or more first electrical connections disposed within the first electrical-connection cut-in such that at least a portion of the one or more first electrical connections does not extend, in the direction, beyond the second outer surface.

In some implementations, an semiconductor package includes a metal layer; a solder mask surrounding a plurality of electrical connections; a dielectric interposer disposed between the metal layer and the solder mask, wherein the dielectric interposer includes a first outer surface coupled to the metal layer and an opposing second outer surface spaced apart from the first outer surface in a direction and coupled to the solder mask; a first electrical-connection cut-in provided in the second outer surface that extends, in the direction, toward the first outer surface; and one or more first electrical connections disposed within the first electrical-connection cut-in.

In some implementations, a memory device includes a base layer; a dielectric interposer coupled to the base layer and including a first outer surface facing the base layer and an opposing second outer surface facing away from the base layer and spaced apart from the first outer surface in a direction; a first electrical-connection cut-in in the second outer surface that extends, in the direction, toward the first outer surface; one or more first electrical connections disposed within the first electrical-connection cut-in such that at least a portion of the one or more first electrical connections does not extend, in the direction, beyond the second outer surface; and a memory die electrically coupled to the one or more first electrical connections.

In some implementations, a method includes receiving a base layer; placing a dielectric interposer on the base layer such that a first outer surface of the dielectric interposer faces the base layer, and an opposing second outer surface of the dielectric interposer spaced apart from the first outer surface in a direction faces away from the base layer; forming a first electrical-connection cut-in in the second outer surface that extends, in the direction, toward the first outer surface; and depositing one or more first electrical connections within the first electrical-connection cut-in such that at least a portion of the one or more first electrical connections does not extend, in the direction, beyond the second outer surface.

In some implementations, a method includes forming a dielectric interposer having a first outer surface and an opposing second outer surface; etching an electrical-connection cut-in in the second outer surface that extends toward the first outer surface; and depositing one or more first electrical connections within the first electrical-connection cut-in.

In some implementations, a method includes receiving a base layer; and placing a dielectric interposer on the base layer such that a first outer surface of the dielectric interposer faces the base layer and an opposing second outer surface of the dielectric interposer spaced apart from the first outer surface in a direction faces away from the base layer, wherein the dielectric interposer includes an electrical-connection cut-in in the second outer surface that extends, in the direction, toward the first outer surface.

In some implementations, a method includes placing a dielectric interposer on a base layer such that a first outer surface of the dielectric interposer faces the base layer and an opposing second outer surface of the dielectric interposer spaced apart from the first outer surface in a direction faces away from the base layer, wherein the dielectric interposer includes a first electrical-connection cut-in in the second outer surface that extends, in the direction, toward the first outer surface; and electrically coupling one or more second electrical connections of a memory die to the one or more first electrical connections.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings. As used herein, the term "substantially" means "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:
a base layer;
a dielectric interposer coupled to the base layer and including a first outer surface facing the base layer and an opposing second outer surface facing away from the base layer and spaced apart from the first outer surface in a direction;
a first electrical-connection cut-in in the second outer surface that extends, in the direction, toward the first outer surface; and
one or more first electrical connections isolated from the first outer surface and disposed within the first electrical-connection cut-in such that at least a portion of the one or more first electrical connections does not extend, in the direction, beyond the second outer surface.

2. The semiconductor device assembly of claim 1, wherein no portion of the one or more first electrical connections extends, in the direction, beyond the second outer surface.

3. The semiconductor device assembly of claim 1, further comprising
one or more second electrical connections disposed on the second outer surface.

4. The semiconductor device assembly of claim 3, wherein a dimension, in the direction, of the one or more first electrical connections is substantially equal to a corresponding dimension, in the direction, of the one or more second electrical connections.

5. The semiconductor device assembly of claim 3, wherein a dimension, in the direction, of the one or more first electrical connections is greater than a corresponding dimension, in the direction, of the one or more second electrical connections.

6. The semiconductor device assembly of claim 3, wherein the one or more first electrical connections and the one or more second electrical connections, extend, in the direction, a same distance past the second outer surface.

7. The semiconductor device assembly of claim 1, further comprising:
a second electrical-connection cut-in in the second outer surface that extends, in the direction, toward the first outer surface; and
one or more second electrical connections disposed within the second electrical-connection cut-in such that at least a portion of the one or more second electrical connections does not extend, in the direction, beyond the second outer surface,
wherein the one or more first electrical connections are associated with one of wire bond connections or bump bond connections, and wherein the one or more second electrical connections are associated with the other one of the wire bond connections or the bump bond connections.

8. A semiconductor package, comprising:
a metal layer;
a solder mask surrounding a plurality of electrical connections;
a dielectric interposer disposed between the metal layer and the solder mask, wherein the dielectric interposer includes a first outer surface coupled to the metal layer and an opposing second outer surface spaced apart from the first outer surface in a direction and coupled to the solder mask;
a first electrical-connection cut-in provided in the second outer surface that extends, in the direction, toward the first outer surface; and
one or more first electrical connections isolated from the first outer surface and disposed within the first electrical-connection cut-in.

9. The semiconductor package of claim 8, wherein at least a portion of the one or more first electrical connections does not extend, in the direction, beyond the second outer surface.

10. The semiconductor package of claim 8, wherein no portion of the one or more first electrical connections extends, in the direction, beyond the second outer surface.

11. The semiconductor package of claim 8, further comprising
one or more second electrical connections disposed on the second outer surface.

12. The semiconductor package of claim 11, wherein a dimension, in the direction, of the one or more first electrical connections is substantially equal to a corresponding dimension, in the direction, of the one or more second electrical connections.

13. The semiconductor package of claim 11, wherein a dimension, in the direction, of the one or more first electrical connections is greater than a corresponding dimension, in the direction, of the one or more second electrical connections.

14. The semiconductor package of claim 11, wherein the one or more first electrical connections and the one or more second electrical connections, extend, in the direction, a same distance past the second outer surface.

15. The semiconductor package of claim 8, further comprising:
a second electrical-connection cut-in in the second outer surface that extends, in the direction, toward the first outer surface; and
one or more second electrical connections disposed within the second electrical-connection cut-in,
wherein the one or more first electrical connections are associated with one of wire bond connections or bump bond connections, and wherein the one or more second electrical connections are associated with the other one of the wire bond connections or the bump bond connections.

16. A memory device, comprising:
a base layer;
a dielectric interposer coupled to the base layer and including a first outer surface facing the base layer and an opposing second outer surface facing away from the base layer and spaced apart from the first outer surface in a direction;

a first electrical-connection cut-in in the second outer surface that extends, in the direction, toward the first outer surface;

one or more first electrical connections isolated from the first outer surface and disposed within the first electrical-connection cut-in such that at least a portion of the one or more first electrical connections does not extend, in the direction, beyond the second outer surface; and a memory die electrically coupled to the one or more first electrical connections.

17. The memory device of claim 16, wherein the memory die is electrically coupled to the one or more first electrical connections via a plurality of wire bonds.

18. The memory device of claim 16, wherein the memory die is electrically coupled to the one or more first electrical connections via a plurality of bump bonds.

19. The memory device of claim 16, wherein the memory die is electrically coupled to the one or more first electrical connections via a plurality of wire bonds and a plurality of bump bonds.

20. The memory device of claim 16, wherein no portion of the one or more first electrical connections extends, in the direction, beyond the second outer surface.

21. The memory device of claim 16, further comprising one or more second electrical connections disposed on the second outer surface.

22. The memory device of claim 16, further comprising:

a second electrical-connection cut-in in the second outer surface that extends, in the direction, toward the first outer surface; and one or more second electrical connections disposed within the second electrical-connection cut-in such that at least a portion of the one or more second electrical connections does not extend, in the direction, beyond the second outer surface, wherein the one or more first electrical connections are associated with one of wire bond connections or bump bond connections, and wherein the one or more second electrical connections are associated with the other one of the wire bond connections or the bump bond connections.

23. A semiconductor device, comprising:

a dielectric interposer having a first outer surface and an opposing second outer surface;

an electrical-connection cut-in in the second outer surface that extends toward the first outer surface; and one or more first electrical connections isolated from the first outer surface and within the electrical-connection cut-in.

24. The semiconductor device of claim 23, further comprising:

a base layer, wherein the dielectric interposer is on the base layer such that the first outer surface of the dielectric interposer faces the base layer and the second outer surface faces away from the base layer; and a solder mask on the second outer surface and over the one or more first electrical connections within the electrical-connection cut-in.

25. The semiconductor device of claim 23, further comprising:

a memory die on the dielectric interposer, wherein one or more second electrical connections of the memory die are coupled to the one or more first electrical connections.

26. The semiconductor device of claim 23, wherein no portion of the one or more first electrical connections extends beyond the second outer surface.

27. The semiconductor device of claim 23, further comprising:

one or more second electrical connections on the second outer surface.

28. A semiconductor package, comprising:

a dielectric interposer, disposed between a metal layer and a solder mask, having a first outer surface and an opposing second outer surface;

a first electrical-connection cut-in provided in the second outer surface that extends, in a direction, toward the first outer surface; and one or more first electrical connections isolated from the first outer surface and disposed within the first electrical-connection cut-in.

29. The semiconductor package of claim 28, wherein the solder mask surrounds a plurality of electrical connections.

30. The semiconductor package of claim 28, wherein the first outer surface is coupled to the metal layer and the second outer surface is spaced apart from the first outer surface in the direction and coupled to the solder mask.

31. The semiconductor package of claim 28, wherein the one or more first electrical connections do not extend beyond the second outer surface.

32. The semiconductor package of claim 28, further comprising:

one or more second electrical connections disposed on the second outer surface; and a memory die coupled to the one or more second electrical connections.

33. The semiconductor package of claim 32, wherein the one or more first electrical connections are associated with one of wire bond connections or bump bond connections, and wherein the one or more second electrical connections are associated with the other one of the wire bond connections or the bump bond connections.

34. The semiconductor package of claim 32, wherein a dimension, in the direction, of the one or more first electrical connections is greater than a corresponding dimension, in the direction, of the one or more second electrical connections.

35. The semiconductor package of claim 28, further comprising:

a second electrical-connection cut-in in the second outer surface that extends, in the direction, toward the first outer surface.

* * * * *